US010861924B2

(12) United States Patent
Li et al.

(10) Patent No.: US 10,861,924 B2
(45) Date of Patent: Dec. 8, 2020

(54) DISPLAY PANEL AND DISPLAY DEVICE WITH NOTCH

(71) Applicant: WUHAN TIANMA MICRO-ELECTRONICS CO., LTD., Wuhan (CN)

(72) Inventors: Bo Li, Wuhan (CN); Tianqing Hu, Shanghai (CN); Zhaokeng Cao, Shanghai (CN)

(73) Assignee: WUHAN TIANMA MICRO-ELECTRONICS CO., LTD., Wuhan (CN)

( * ) Notice: Subject to any disclaimer, the term of this patent is extended or adjusted under 35 U.S.C. 154(b) by 63 days.

(21) Appl. No.: 16/208,936

(22) Filed: Dec. 4, 2018

(65) Prior Publication Data

US 2019/0109184 A1    Apr. 11, 2019

(30) Foreign Application Priority Data

Sep. 30, 2018   (CN) .......................... 2018 1 1157253

(51) Int. Cl.
*H01L 27/32*      (2006.01)
*G09G 3/3266*    (2016.01)
(Continued)

(52) U.S. Cl.
CPC .... *H01L 27/3276* (2013.01); *G02F 1/136286* (2013.01); *G06F 1/163* (2013.01);
(Continued)

(58) Field of Classification Search
CPC ............. H01L 27/3276; H01L 27/3248; H01L 51/0096; G02F 1/136286; G06F 1/163;
(Continued)

(56) References Cited

U.S. PATENT DOCUMENTS 10,580,362 B2 *   3/2020   Park ..................... G09G 3/3266
2005/0057580 A1 * 3/2005   Yamano .............. G09G 3/3283
                                                                    345/690

(Continued)

FOREIGN PATENT DOCUMENTS

CN            108389538 A        8/2018

*Primary Examiner* — Stephen G Sherman
(74) *Attorney, Agent, or Firm* — Anova Law Group PLLC

(57) ABSTRACT

A display panel includes a display area, and the display area is disposed with a plurality of data lines extending along a first direction. The display area has a notch, and the boundary of the display area is recessed into the display area in a second direction to form the notch. The display area includes a first display area and two second display areas. The display panel also includes a non-display area disposed around the display area. The non-display area includes a first non-display area and two second non-display areas located in the notch. The first non-display area extends along the first direction, and is adjacent to the first display area in the second direction. In the first direction, each of the second non-display areas is adjacent to one of the second display areas. The display panel also includes a drive circuit, and the drive circuit includes a plurality of shift registers. The second direction intersects with the first direction. In the second direction, the first display area is located at one side of the notch. In the first direction, the two second display areas are located at two sides of the notch respectively, and the two second display areas are adjacent to the first display area. The display area includes a plurality of signal lines extending along the second direction, and one shift register is electrically connected to at least one signal line. The second non-display areas are disposed with the shift registers, and the shift registers disposed in the second non-display areas are electrically connected to the signal lines located in the first display area.

20 Claims, 11 Drawing Sheets

(51) Int. Cl.
  *G06F 1/16* (2006.01)
  *G02F 1/1362* (2006.01)
  *G09G 3/36* (2006.01)
  *G09G 3/3275* (2016.01)
  *H01L 51/00* (2006.01)

(52) U.S. Cl.
  CPC ......... *G09G 3/3266* (2013.01); *G09G 3/3275* (2013.01); *G09G 3/3677* (2013.01); *G09G 3/3688* (2013.01); *H01L 27/3248* (2013.01); *H01L 51/0096* (2013.01); *G06F 1/1637* (2013.01); *G06F 1/1652* (2013.01); *G09G 2310/0286* (2013.01); *G09G 2320/028* (2013.01)

(58) Field of Classification Search
  CPC ... G06F 1/1637; G06F 1/1652; G09G 3/3266; G09G 3/3275; G09G 3/3677; G09G 3/3688; G09G 2310/0286; G09G 2320/028
  See application file for complete search history.

(56) References Cited

U.S. PATENT DOCUMENTS

| | | | |
|---|---|---|---|
| 2017/0352311 A1* | 12/2017 | Lee | G09G 3/3648 |
| 2018/0040291 A1* | 2/2018 | Wu | G09G 5/003 |
| 2018/0129111 A1* | 5/2018 | Wu | G02F 1/13338 |
| 2018/0190190 A1* | 7/2018 | Xi | G09G 3/3208 |
| 2019/0331974 A1* | 10/2019 | Furuta | G09G 3/20 |

* cited by examiner

DISPLAY PANEL AND DISPLAY DEVICE WITH NOTCH

CROSS-REFERENCES TO RELATED APPLICATIONS

This application claims priority of Chinese Patent Application No. 201811157253.4, filed on Sep. 30, 2018, the entire contents of which are hereby incorporated by reference.

FIELD OF THE INVENTION

The present disclosure generally relates to the field of display technologies and, more particularly, relates to a display panel and a display device.

BACKGROUND

In current display device technologies, display panels mainly include two major types: a liquid crystal display panel and an organic self-luminous display panel. In a liquid crystal display panel, an electric field capable of controlling deflection of liquid crystal molecules is formed by applying an electric voltage between a pixel electrode and a common electrode. The electric field controls light transmission to realize a display function of the display panel. An organic self-luminous display panel uses an organic electroluminescent material. When an electric current passes through the organic electroluminescent material, the electroluminescent material emits light, realizing a display function of the display panel.

With the application of display technologies in smart wearables and other portable electronic devices, design of electronic products has been pursuing user-friendly experiences. Further, sensory experiences of users are becoming significant in the design of electronic products. For example, performances such as wide viewing angle, high resolution, narrow border, and high screen-to-body ratio, have become selling points of various types of electronic products. Therefore, it is urgent to provide a display panel and a display device with a narrow border and a high screen-to-body ratio.

The disclosed methods and structures are directed to solve one or more problems set forth above and other problems in the art.

BRIEF SUMMARY OF THE DISCLOSURE

One aspect of the present disclosure includes a display panel. The display panel includes a display area, and the display area is disposed with a plurality of data lines extending along a first direction. The display area has a notch, and the boundary of the display area is recessed into the display area in a second direction to form the notch. The display area includes a first display area and two second display areas. The display panel also includes a non-display area disposed around the display area. The non-display area includes a first non-display area and two second non-display areas located in the notch. The first non-display area extends along the first direction, and is adjacent to the first display area in the second direction. In the first direction, each of the second non-display areas is adjacent to one of the second display areas. The display panel also includes a drive circuit, and the drive circuit includes a plurality of shift registers. The second direction intersects with the first direction. In the second direction, the first display area is located at one side of the notch. In the first direction, the two second display areas are located at two sides of the notch respectively, and the two second display areas are adjacent to the first display area. The display area includes a plurality of signal lines extending along the second direction, and one shift register is electrically connected to at least one signal line. The second non-display areas are disposed with the shift registers, and the shift registers disposed in the second non-display areas are electrically connected to the signal lines located in the first display area.

Another aspect of the present disclosure includes a display device. The display device includes a display panel comprising a display area, and the display area is disposed with a plurality of data lines extending along a first direction. The display area has a notch, and the boundary of the display area is recessed into the display area in a second direction to form the notch. The display area includes a first display area and two second display areas. The display panel also includes a non-display area disposed around the display area. The non-display area includes a first non-display area and two second non-display areas located in the notch. The first non-display area extends along the first direction, and is adjacent to the first display area in the second direction. In the first direction, each of the second non-display areas is adjacent to one of the second display areas. The display panel also includes a drive circuit, and the drive circuit includes a plurality of shift registers. The second direction intersects with the first direction. In the second direction, the first display area is located at one side of the notch. In the first direction, the two second display areas are located at two sides of the notch respectively, and the two second display areas are adjacent to the first display area. The display area includes a plurality of signal lines extending along the second direction, and one shift register is electrically connected to at least one signal line. The second non-display areas are disposed with the shift registers, and the shift registers disposed in the second non-display areas are electrically connected to the signal lines located in the first display area.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

To make the objectives, technical solutions and advantages of the present invention more clear and explicit, the present invention is described in further detail with accompanying drawings and embodiments. It should be understood that the specific exemplary embodiments described herein are only for explaining the present invention and are not intended to limit the present invention.

Reference will now be made in detail to exemplary embodiments of the present invention, which are illustrated in the accompanying drawings. Wherever possible, the same reference numbers will be used throughout the drawings to refer to the same or like parts.

It should be noted that arrangements of components and steps, numerical expressions and numerical values in exemplary embodiments are not intended to limit the scope of the present disclosure.

Techniques, methods and apparatus known to those skilled in the relevant art may not be discussed in detail, but where appropriate, these techniques, methods and apparatus should be considered as a part of the disclosed embodiments.

Figure 1:
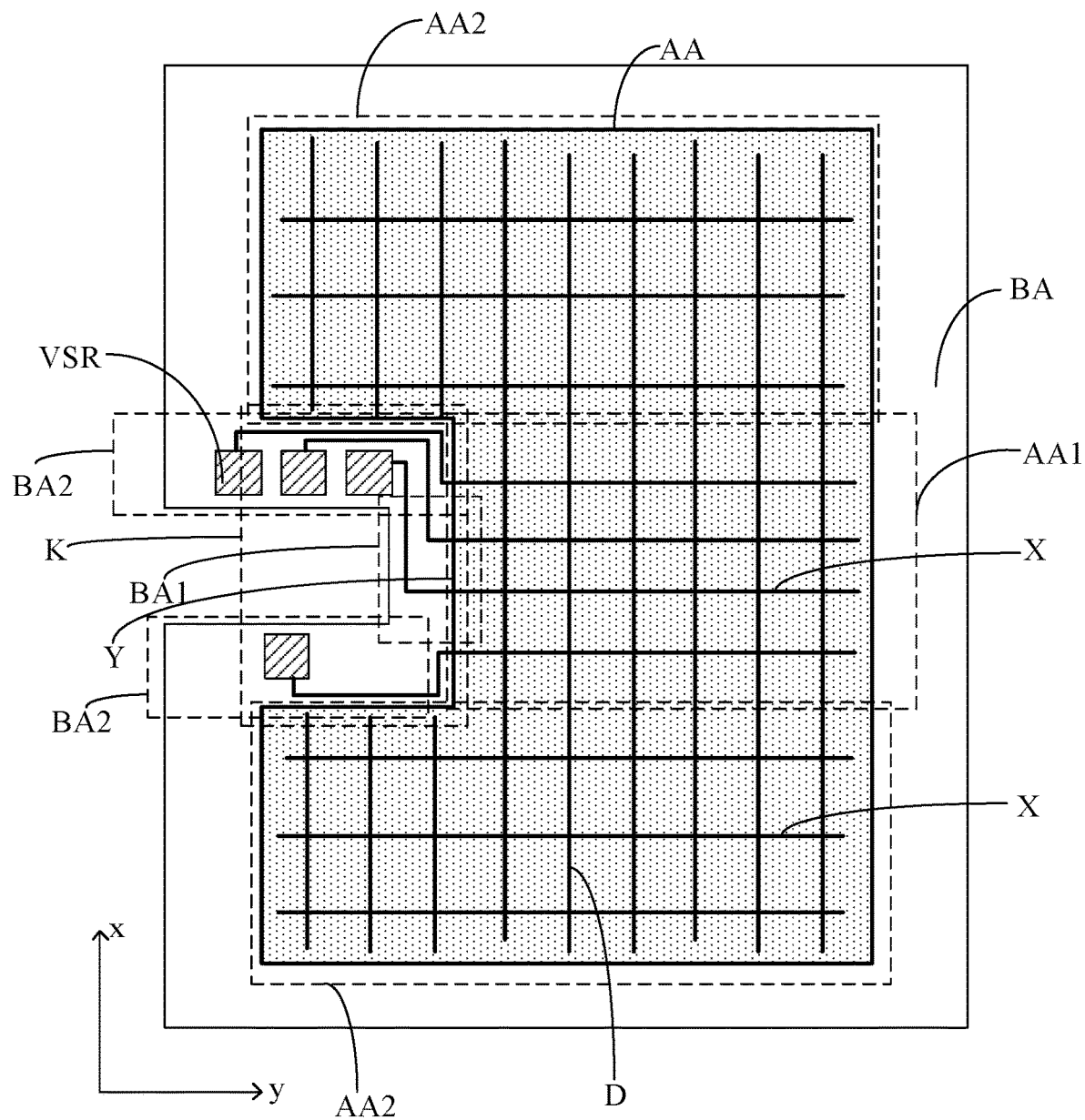
FIG. 1 illustrates a top view of an exemplary display panel consistent with the disclosed embodiments.

The present disclosure provides a display panel. FIG. 1 illustrates a top view of an exemplary display panel consistent with the disclosed embodiments. As shown in FIG. 1, the display panel includes a display area AA, a non-display area BA disposed around the display area AA, and a drive circuit.

As shown in FIG. 1, the display area AA is disposed with a plurality of data lines D extending along a first direction x. The display area AA has a notch K, and a boundary Y of the display area AA is recessed into the display area AA in a second direction y to form the notch K. The second direction y intersects with the first direction x. The display area AA includes a first display area AA1 and two second display areas AA2. In the second direction y, the first display area AA1 is located at one side of the notch K. In the first direction x, the two second display areas AA2 are located at two sides of the notch K respectively. In the first direction x, the two second display areas AA2 are adjacent to the first display area AA1. It should be noted that various parameters (size, number of pixels, etc.) of the two first display areas AA1 located at two sides of the notch K may be identical, or the various parameters of the two first display areas AA1 may be different.

As shown in FIG. 1, the non-display area BA includes a first non-display area BA1 and two second non-display areas BA2 located in the notch K. The first non-display area BA1 extends along the first direction x, and is adjacent to the first display area AA1 in the second direction y. Each of the two second non-display areas BA2 is adjacent to one second display area AA2 in the first direction x.

As shown in FIG. 1, the drive circuit includes a plurality of cascaded shift registers VSR. The display area AA includes a plurality of signal lines X extending along the second direction y, and one shift register VSR is electrically connected to at least one signal line X. In the exemplary display panel shown in FIG. 1, one shift register VSR is electrically connected to only one signal line X. The shift registers VSR are disposed in the second non-display areas BA2, and the shift registers VSR disposed in the second non-display areas BA2 are electrically connected to the signal lines X located in the first display area AA1. In FIG. 1, the numbers of the shift registers VSR disposed in the two second non-display areas BA2 are for illustrative purposes only.

In a conventional display panel, signal lines in a display area are electrically connected to shift registers in a non-display area adjacent to the display area. In a display panel of the present disclosure, shift registers in the second non-display areas are electrically connected to signal lines in the first display area for driving the signal lines in the first display area. Therefore, the number of shift registers in the first non-display area may be reduced, and moreover, maybe no shift register is disposed in the first non-display area. This configuration may save space of the first non-display area, and narrow the first non-display area.

In one embodiment, the numbers of shift registers respectively disposed in the two second non-display areas are same. The shift registers for driving the signal lines in the first display area may be uniformly disposed in the two second non-display areas, and the sizes of the two second non-display areas may be substantially same.

In one embodiment, as shown in FIG. 1, no shift register VSR is disposed in the first non-display area BA1. As shift registers occupy much space in a non-display area, when no shift register is disposed in the first non-display area, the space of the first non-display area may be saved, and thus the first non-display area may be narrowed.

Figure 2:
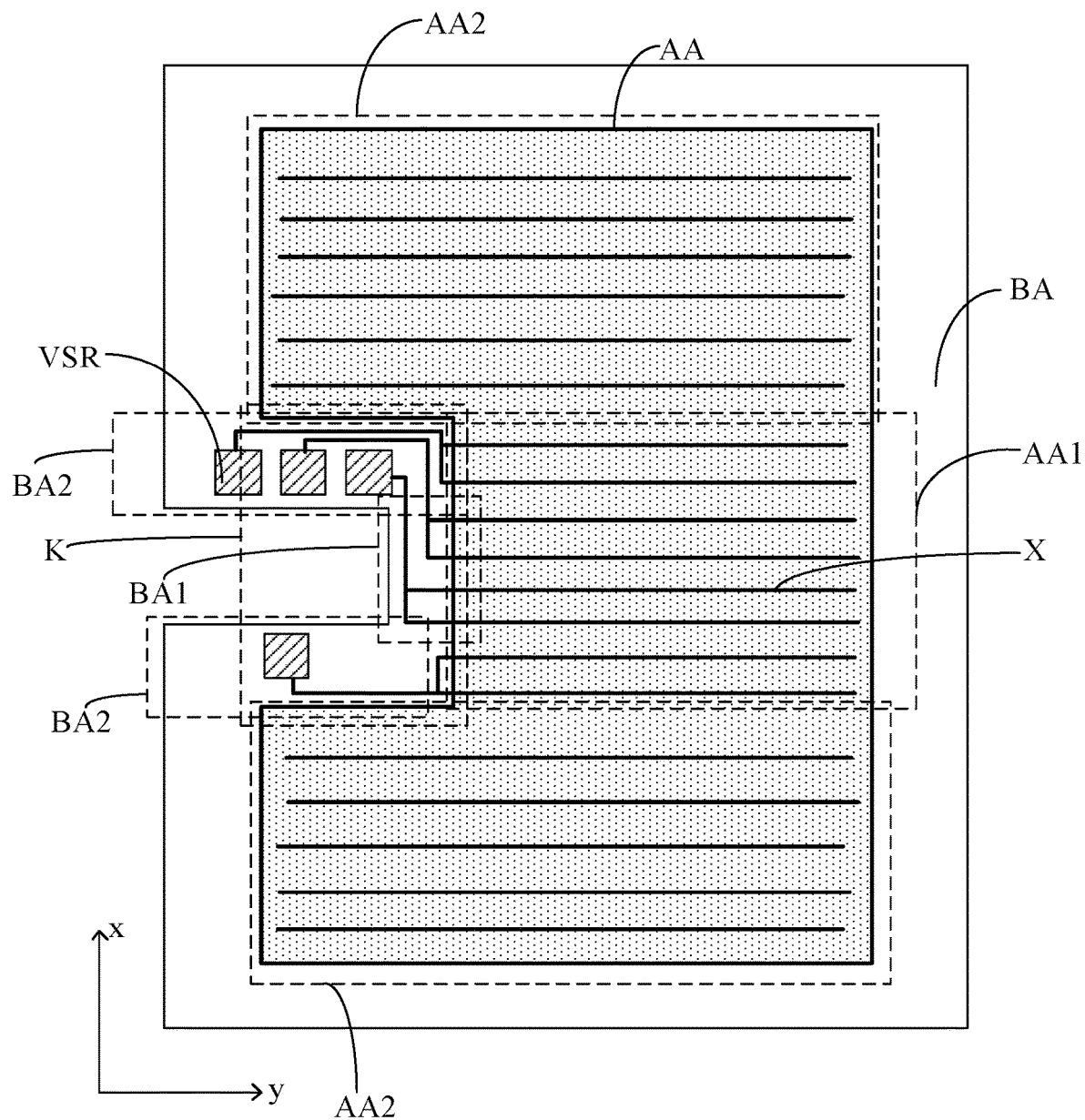
FIG. 2 illustrates a schematic diagram of an exemplary implementation of a display panel consistent with the disclosed embodiments.

FIG. 2 illustrates a schematic diagram of an exemplary implementation of a display panel. As shown in FIG. 2, two signal lines X located in the first display area AA1 and adjacent in the first direction x are electrically connected to a same shift register VSR. In one embodiment, as two adjacent signal lines are electrically connected to a same shift register, the two signal lines may be driven by one shift register, so the number of shift registers disposed in the non-display area may be reduced. Accordingly, the space of the non-display area may be saved, and the non-display area may be narrowed.

In some other embodiments, to reduce the number of the shift registers disposed in the non-display area, three signal lines arranged in sequence may be electrically connected to a same shift register.

Figure 3:
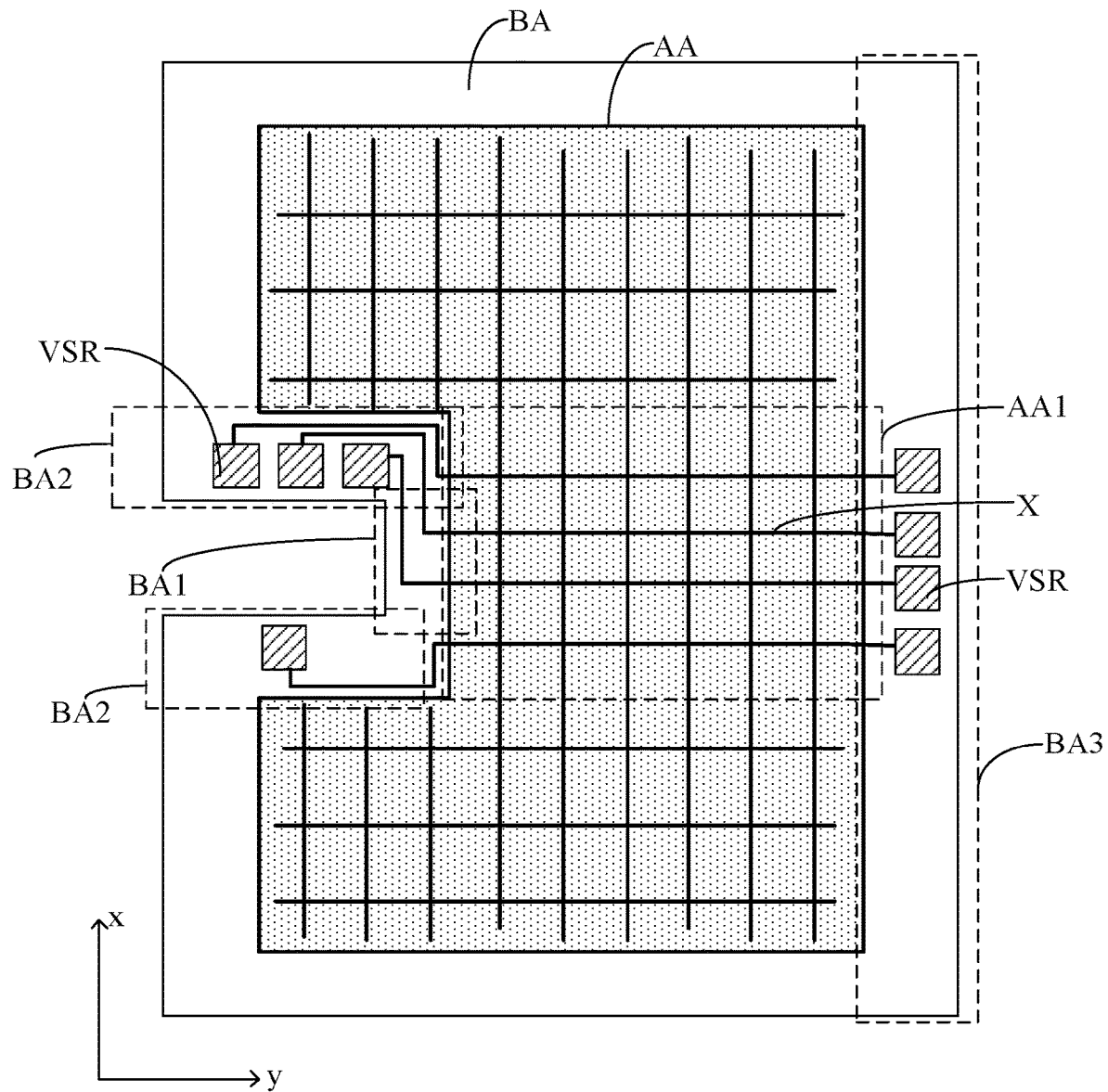
FIG. 3 illustrates a schematic diagram of another exemplary implementation of a display panel consistent with the disclosed embodiments.

FIG. 3 illustrates a schematic diagram of another exemplary implementation of a display panel. As shown in FIG. 3, the non-display area BA further includes a third non-display area BA3 extending along the first direction x. In the second direction y, the third non-display area BA3 and the first non-display area BA1 are respectively located at two sides of the first display area AA1. Shift registers VSR are disposed in the third non-display area BA3. Two ends of one signal line X located in the first display area AA1 are electrically connected to two shift registers VSR located at the second non-display area BA2 and the third non-display areas BA3 respectively. In one embodiment, two ends of one signal line in the first display area are electrically connected to two shift registers located at the second non-display area and the third non-display area, respectively. This configuration may include two advantages. First, as the number of the shift registers disposed in the first non-display area may be reduced, the first non-display area may be narrowed. Second, as drive signals are simultaneously provided to two ends of a signal line in the first display area, voltage signals on the pixels electrically connected to the signal line are substantially same, and as a result, the brightness uniformity of the first display area may be ensured.

Figure 4:
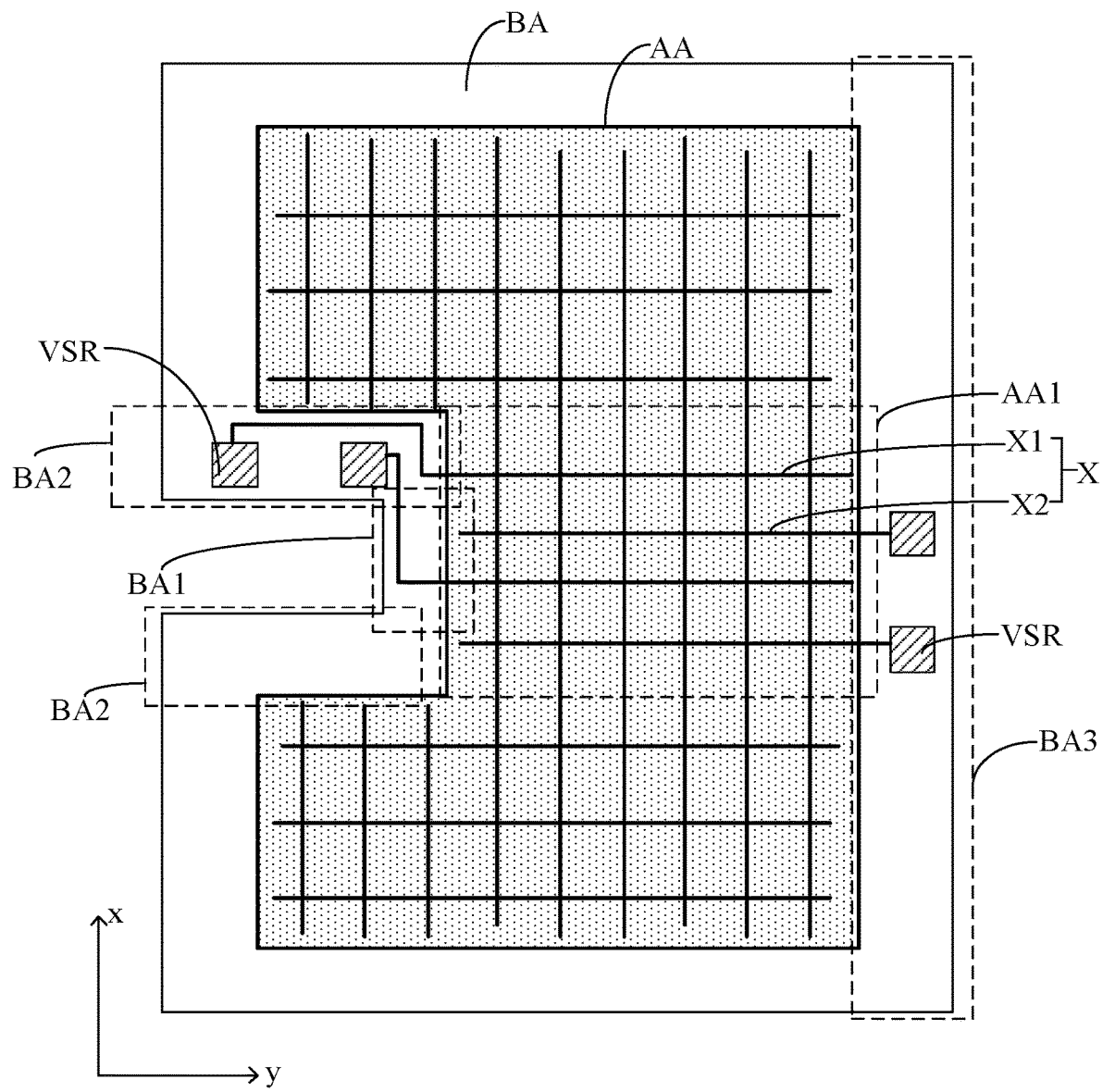
FIG. 4 illustrates a schematic diagram of another exemplary implementation of a display panel consistent with the disclosed embodiments.

FIG. 4 illustrates a schematic diagram of another exemplary implementation of a display panel. As shown in FIG. 4, the non-display area BA further includes a third non-display area BA3 extending along the first direction x. In the second direction y, the third non-display area BA3 and the first non-display area AA1 are respectively located at two sides of the first display area AA1. The third non-display area BA3 is disposed with shift registers VSR. The signal lines X include a first signal line X1 and a second signal line X2 that are adjacent in the first direction x. The first signal lines X1 located in the first display area AA1 are electrically connected to the shift registers located in the second non-display area BA2, and the second signal lines X2 located in the first display area AA1 are electrically connected to the shift registers located in the third non-display area BA3.

Thus, as the shift registers located in the second non-display area are electrically connected to the first signal lines located in the first display area, the number of shift registers in the first non-display area may be reduced, and thus the first non-display area may be narrowed. Further, for each signal line, only one end is electrically connected to one shift register, so the number of shift registers disposed in the second non-display area and the third non-display area may be reduced, and thus the spaces of the second non-display area and the third non-display area may be saved. Moreover, as the first signal lines and the second signal lines are alternately disposed in the display area, display uniformity of the display area may be ensured.

The display panel provided by the present disclosure may be a liquid crystal display panel or an organic light emitting display panel.

When the display panel is a liquid crystal display panel, the display panel includes an array substrate and a color filter substrate that are oppositely disposed, and a liquid crystal molecular layer disposed between the array substrate and the color filter substrate. The drive circuit in the display panel includes a scan drive circuit, and the scan drive circuit includes a plurality of cascaded scan shift registers. The signal lines in the display panel include scan lines, and the scan drive circuit drives the scan lines. In one embodiment, the scan lines in the first display area adjacent to the notch in the second direction are electrically connected to the scan shift registers located in the second non-display areas. Therefore, the number of scan shift registers located in the first non-display area adjacent to the first display area may be reduced, and further, maybe no scan shift register is disposed in the first non-display area. As a result, this configuration may save the space of the first non-display area, and thus the first non-display area may be narrowed.

When the display panel is an organic light emitting display panel, the display panel includes an array layer, a display layer located above the array layer, a package structure, and a drive circuit. The display layer includes a plurality of organic light emitting components, and the package structure is disposed at a side of the display layer away from the array layer. The package structure may block water and oxygen, and prevent the organic light-emitting components from being damaged by water and oxygen. The drive circuit in the organic light emitting display panel includes a scan drive circuit and a light emitting drive circuit, and signal lines in the display panel include scan lines and light emitting control signal lines. The scan drive circuit includes a plurality of cascaded scan shift registers that are electrically connected to the scan lines. The light emitting drive circuit includes a plurality of cascaded light-emitting shift registers, and the light-emitting shift register are electrically connected to the light-emitting control signal lines.

An organic light emitting display panel may be implemented in several approaches. In one embodiment, only scan lines in the first display area adjacent to the notch in the second direction are electrically connected to scan shift registers located in the second non-display area. In another embodiment, only light emitting control signal lines in the first display area adjacent to the notch in the second direction are electrically connected to light emitting shift registers located in the second non-display area. In another embodiment, scan lines in the first display area adjacent to the notch in the second direction are electrically connected to scan shift registers located in the second non-display area, and meanwhile light emitting control signal lines in the first display area adjacent to the notch in the second direction are electrically connected to light emitting shift registers located in the second non-display area. Therefore, in certain embodiments, the number of scan shift registers disposed in the first non-display area adjacent to the first display area, and/or the number of the light emitting shift registers, may be reduced, and thus the first non-display area may be narrowed.

If the display panel is an organic light emitting display panel, when light-emitting shift registers and scan shift registers are simultaneously disposed in the second non-display areas, there are a plurality of arrangement approaches for the light-emitting shift registers and the scan shift registers. Exemplary arrangement approaches are provided in the embodiments shown in FIGS. 5-8.

Figure 5:
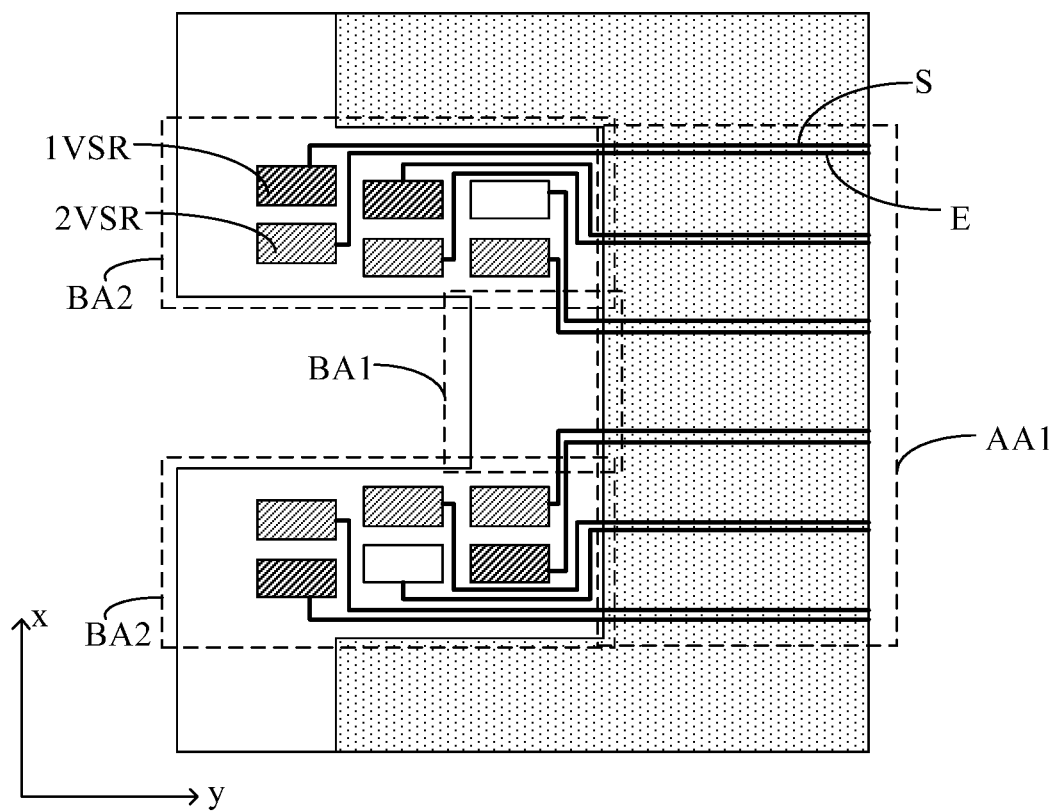
FIG. 5 illustrates a partial schematic view of another exemplary implementation of a display panel consistent with the disclosed embodiments.

FIG. 5 illustrates a partial schematic view of another exemplary implementation of a display panel. As shown in FIG. 5, in a same second non-display area BA2, scan shift registers 1VSR are located at a side of the light-emitting shift registers 2VSR close to the second display area AA2. The scan shift registers 1VSR in the second non-display area BA2 are electrically connected to the scan lines S in the first display area AA1. The light-emitting shift registers 2VSR in the second non-display area BA2 are electrically connected to the light-emitting control signal lines E located in the first display area AA1.

Figure 6:
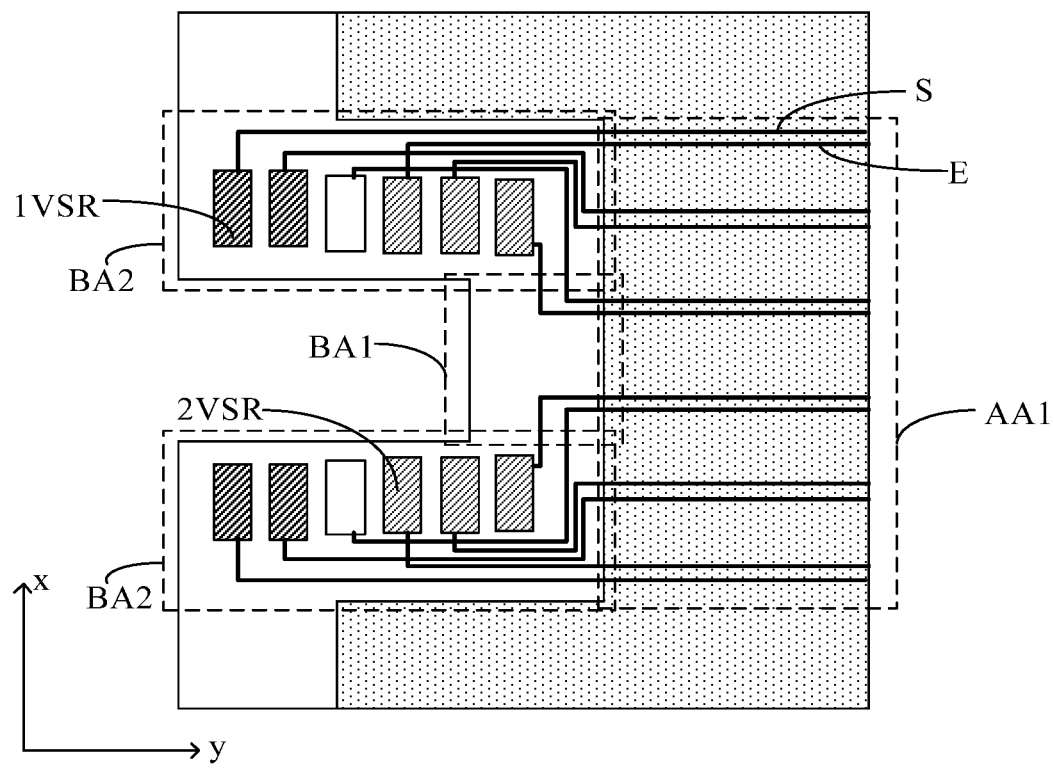
FIG. 6 illustrates a partial schematic view of another exemplary implementation of a display panel consistent with the disclosed embodiments.

In another embodiment, in one second non-display area, all shift registers are sequentially arranged in the second direction. FIG. 6 illustrates a partial schematic view of an exemplary implementation of a display panel. As shown in FIG. 6, in a same second non-display area BA2, the scan shift registers 1VSR and the light-emitting shift registers 2VSR are sequentially arranged in the second direction y. The scan shift registers 1VSR in the second non-display area BA2 are electrically connected to the scan lines S in the first display area AA1. The light-emitting shift registers 2VSR in the second non-display area BA2 are electrically connected to the light-emitting control signal lines E located in the first display area AA1.

Figure 7:
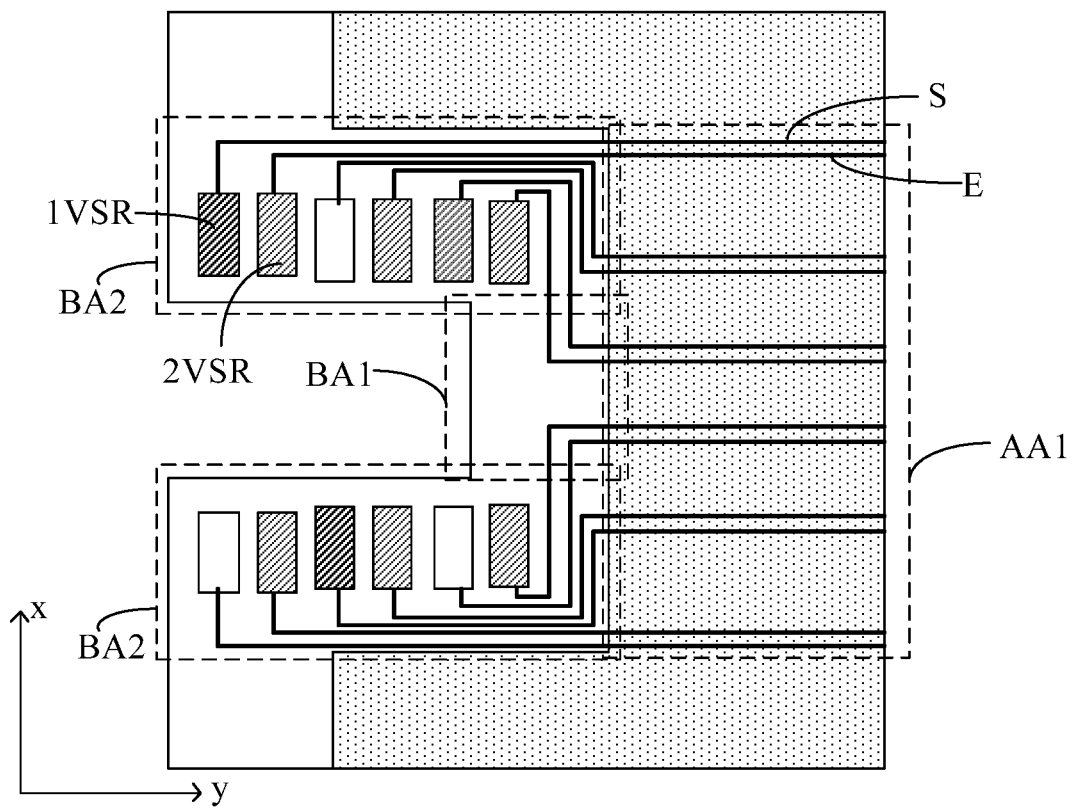
FIG. 7 illustrates a partial schematic view of another exemplary implementation of a display panel consistent with the disclosed embodiments.

FIG. 7 illustrates a partial schematic view of another exemplary implementation of a display panel. As shown in FIG. 7, in a same second non-display area BA2, the scan shift registers 1VSR and the light-emitting shift registers 2VSR are alternately arranged in the second direction y. The scan shift registers 1VSR in the second non-display area BA2 are electrically connected to the scan lines S in the first display area AA1. The light-emitting shift registers 2VSR in the second non-display area BA2 are electrically connected to the light-emitting control signal lines E located in the first display area AA1.

Figure 8:
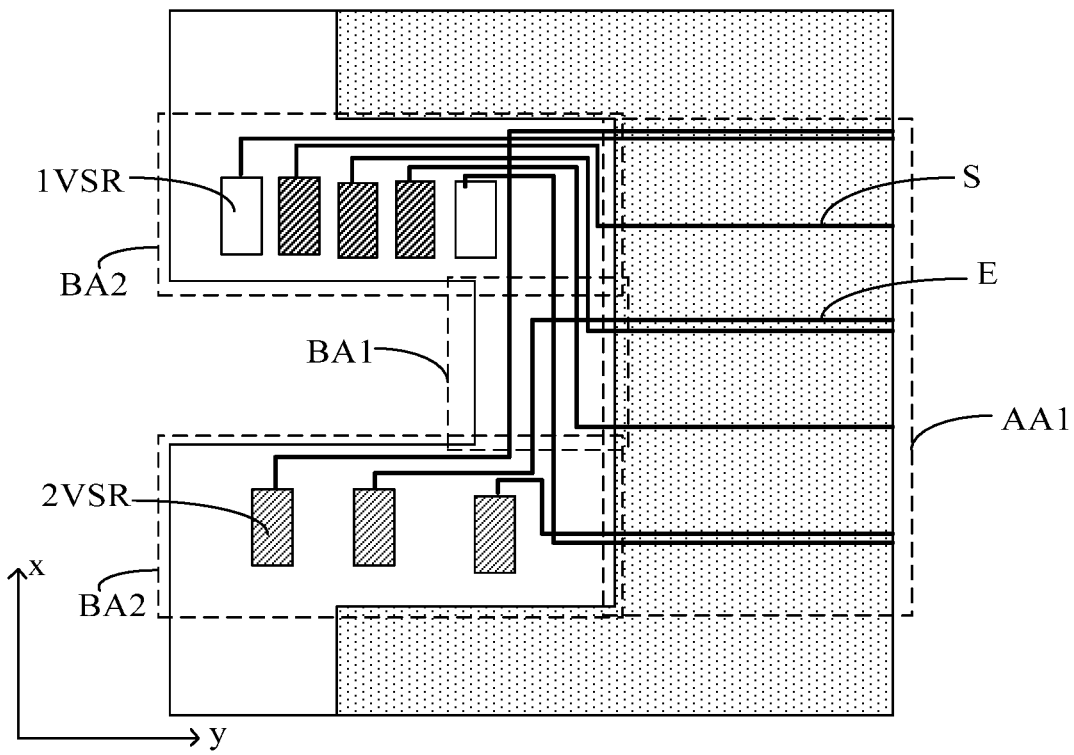
FIG. 8 illustrates a partial schematic view of another exemplary implementation of a display panel consistent with the disclosed embodiments.

FIG. 8 illustrates a partial schematic view of another exemplary implementation of a display panel. As shown in FIG. 8, in the two second non-display areas BA2, one of the second non-display areas BA2 is disposed with scan shift registers 1VSR, and the other second non-display area BA2 is disposed with light-emitting shift registers 2VSR. The scan shift registers 1VSR in the second non-display area BA2 are electrically connected to the scan lines S located in the first display area AA1. The light-emitting shift registers 2VSR in the second non-display area BA2 are electrically connected to the light-emitting control signal lines E located in the first display area AA1.

It should be noted that, FIGS. 5-8 only illustrate exemplary position arrangements of scan shift registers and light-emitting shift registers in second non-display areas. The approaches for driving the scan lines and the light-emitting control signal lines in the first display area may follow the drive approaches illustrated in FIG. 3 and FIG. 4.

In some embodiments, shapes of the shift registers disposed in the second non-display area may follow the shapes illustrated in FIG. 6-8. The short side of the shift registers may be arranged in the second direction, the long side of the shift register may be arranged to extend in the first direction, and the shift registers in a same second non-display area may be arranged in a row. This configuration may effectively use the space of a second non-display area, and minimization of the second non-display area may be achieved by arranging various components and signal lines in the second non-display area.

Figure 9:
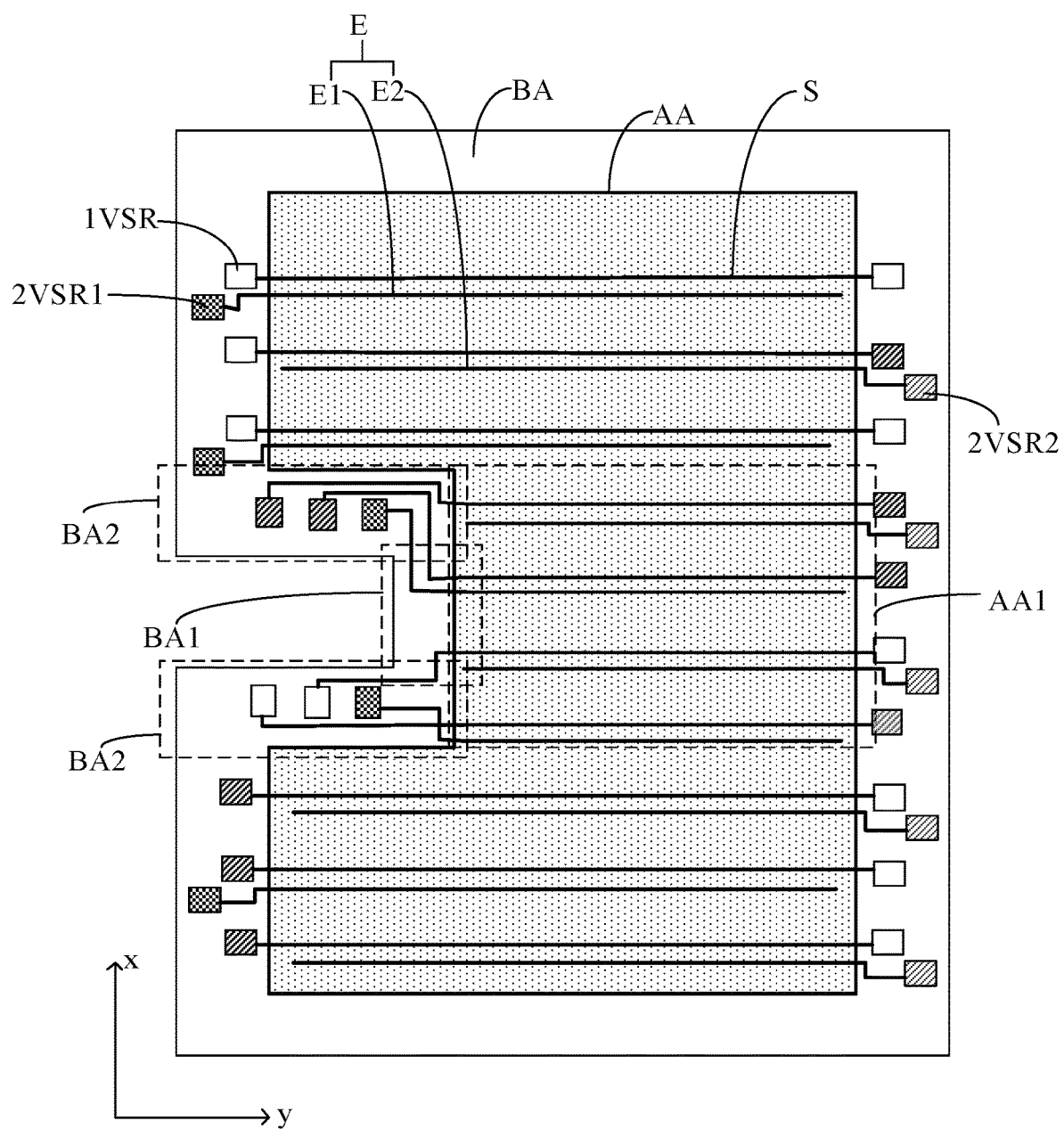
FIG. 9 illustrates a schematic diagram of another exemplary implementation of a display panel consistent with the disclosed embodiments.

FIG. 9 illustrates a schematic diagram of another exemplary implementation of a display panel. As shown in FIG. 9, the signal lines include scan lines S, and two ends of one scan line S are respectively connected to two scan shift registers 1VSR respectively located at two sides of the display area AA in the second direction y. The signal lines further include light-emitting control lines E, and the light-emitting control lines E include a first light-emitting control line E1 and a second light-emitting control line E2 that are adjacent in the first direction x. The light-emitting shift register 2VSR includes a first light-emitting shift register 2VSR1 and a second light-emitting shift register 2VSR2. In the second direction y, the first light-emitting shift register 2VSR1 and the second light-emitting shift register 2VSR2 are respectively located at two sides of the display area AA. The first light-emitting control line E1 is connected to the first light-emitting shift register 2VSR1, and the second light-emitting control line E2 is connected to the second light-emitting shift register 2VSR2.

In one embodiment, two ends of a scan line are electrically connected to two scan shift registers located at two sides of a display area to realize two-side drive of the scan line. As the drive signals are simultaneously provided at two ends of the scan line in the display area, the voltage signals on pixels electrically connected to the scan line are substantially same. The light-emitting control lines in the display area are cross-driven and controlled by the light-emitting shift registers located at two sides of the display area. Therefore, the numbers of light-emitting shift registers located in the non-display areas at two sides of the display area may be reduced, and thus the space of the non-display areas may be saved. Further, as the light-emitting shift registers or the scan shift registers are disposed in the second non-display areas, the space of the first non-display area may be saved, and thus the first non-display area may be narrowed.

Figure 10:
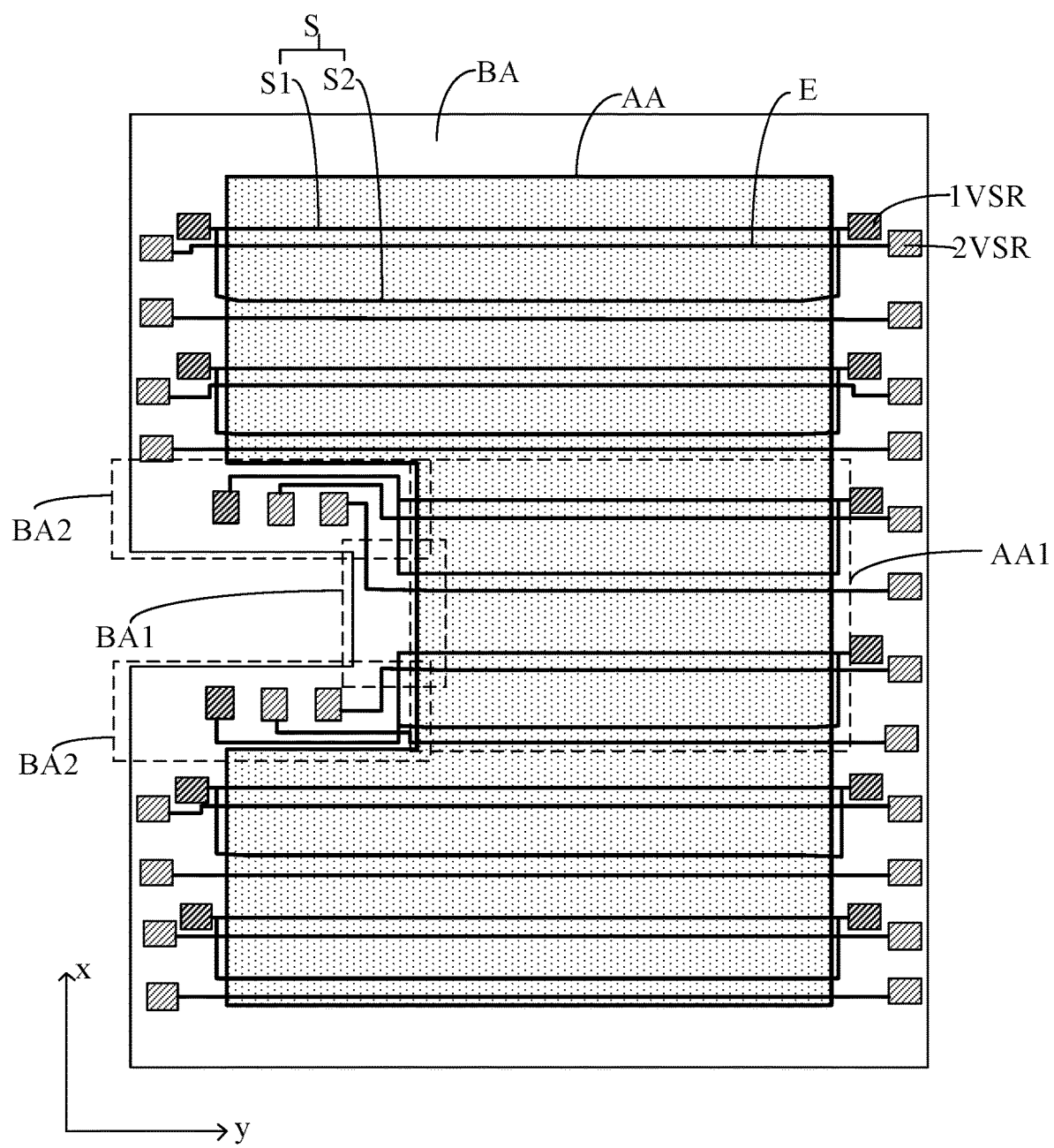
FIG. 10 illustrates a schematic diagram of another exemplary implementation of a display panel consistent with the disclosed embodiments.

FIG. 10 illustrates a schematic diagram of another exemplary implementation of a display panel. As shown in FIG. 10, the signal lines includes a scan line S, and two ends of the scan line S are respectively connected to two scan shift registers 1VSR located at two sides of the display area AA in the second direction y. The scan line S includes in a first scan line S1 and a second scan line S2 that are adjacent in the second direction y. The first scan line S1 and the second scan line S2 are connected to a same scan shift register 1VSR. The signal lines further include a light-emitting control line E. Two ends of the light-emitting control line E are respectively connected to two light-emitting shift registers 2VSR located at two sides of the display area AA in the second direction y.

In one embodiment, two ends of a scan line are connected to two scan shift registers respectively located at two sides of the display area, so two-side drive of the scan line may be achieved. Further, as two adjacent scan lines are connected to a same scan shift register, one scan shift register may drive two scan lines, so the number of scan shift registers may be reduced, and as a result, the non-display area may be narrowed. In addition, as two adjacent scan lines are connected to a same scan shift register, voltage signals on pixels electrically connected to the scan lines are substantially same, and thus the display uniformity may be ensured. Moreover, two ends of a light-emitting control signal line are connected to two light-emitting shift registers respectively located at two sides of the display area, and so two-side drive of the light-emitting control signal line may be realized. Furthermore, the light-emitting shift registers and the scan shift registers are disposed in second non-display areas, so the space of the first non-display area may be saved and thus the first non-display area may be narrowed.

Figure 11:
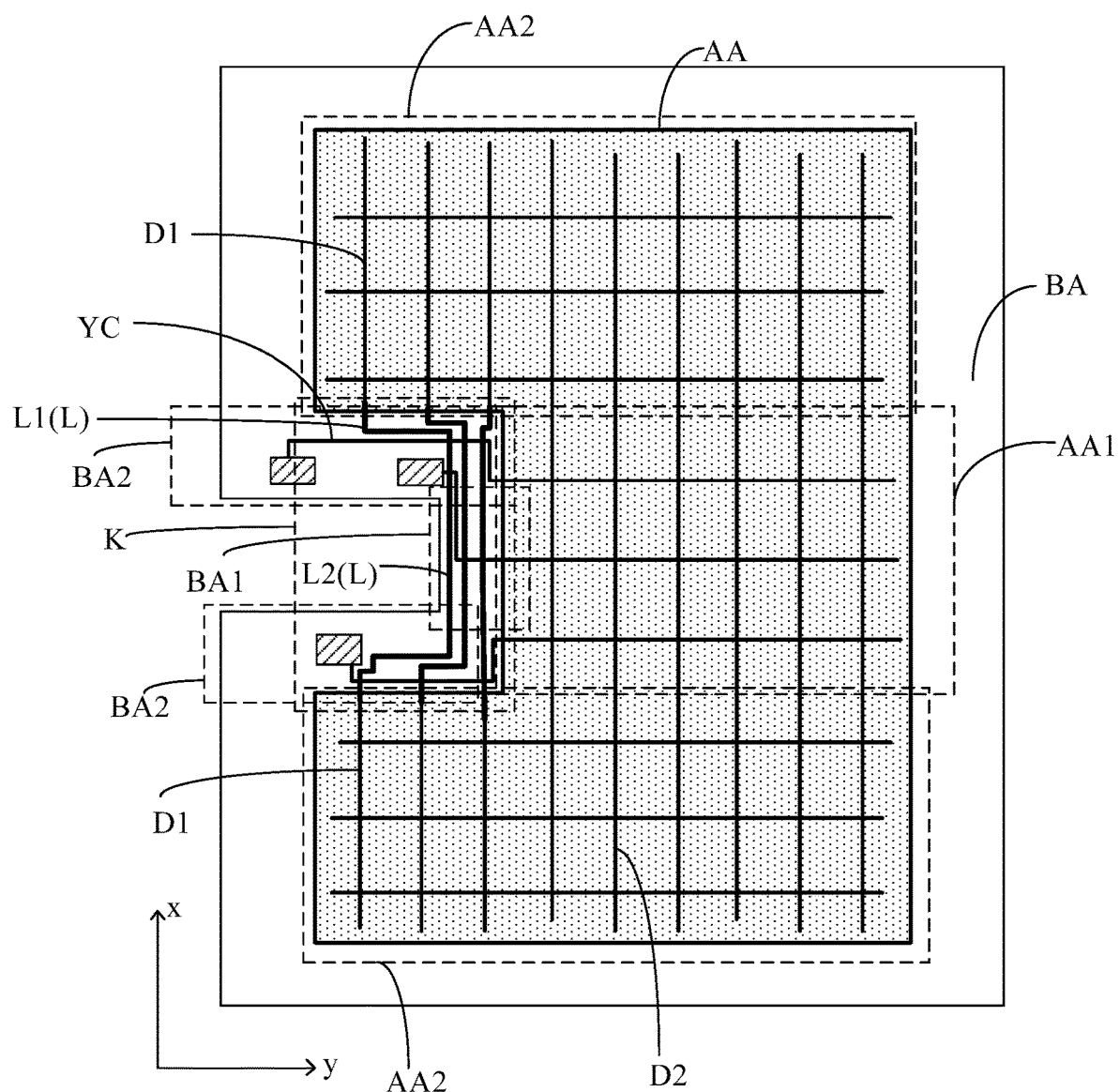
FIG. 11 illustrates a schematic diagram of another exemplary implementation of a display panel consistent with the disclosed embodiments.

FIG. 11 illustrates a schematic diagram of another exemplary implementation of a display panel. As shown in FIG. 11, a plurality of connecting lines L are disposed in the non-display area, and two data lines D1 located at two sides of the notch K in the first direction x and located in a same column are connected through a connecting line L. The connecting line L includes a first line segment L1 and a second line segment L2 that are electrically connected to each other, wherein the first line segment L1 is disposed in the second non-display area BA2, and the second line segment L2 is disposed in the first non-display area BA1.

In one embodiment, signal transmission of two data lines D1 located at two sides of the notch K and located in a same column may be achieved through the connection line L. Since no pixels are disposed at the area where the notch K is located, the number of sub-pixels electrically connected to the data line D1 located at two sides of the notch K is reduced, and so the load on the data line D1 is reduced. Therefore the display panel may have data lines with different loads. As shown in FIG. 11, the load generated by the electrical connection of sub-pixels on the data line D2 is larger than the load generated by the electrical connection of sub-pixels on the data line D1, so the brightness of the sub-pixels connected to the data line D2 and the data line D1 respectively may be different. After the two data lines D1 located at two sides of the notch K are electrically connected through the connection line L, the resistance of the connection line L may increase the load on the data lines D1 to a certain extent. Therefore the connection line L may balance the load difference between the data line D1 and the data line D2, and thus the display uniformity of the display panel may be improved. In one embodiment, shift registers are disposed in the second non-display areas, so the first non-display area may be narrowed. Meanwhile, the connection lines electrically connecting the data lines located at two sides of the notch may improve the display uniformity of the display panel. In addition, the shift registers located in the second non-display areas need to be connected to the signal lines located in the first display area through a lead line (such as the lead line YC shown in FIG. 11). In one embodiment, the first line segment or the second line segment may be insulated from and overlap with the lead line, generating a capacitance. The capacitance may increase the load on data lines, and further improve the display uniformity of the display panel.

Further, as shown in FIG. 11, in certain embodiments, in the second non-display area BA2, the first line segment L1 and the shift register VSR do not overlap in a direction perpendicular to the display panel. That is, shift registers are disposed in the second non-display area to drive the signal lines located in the first display area, so the first non-display area may be narrowed. When connection lines are disposed to connect the data lines located on two sides of the notch, the connection lines need to be routed in the first non-display area and the second non-display area to ensure that the first line segments routed in the second non-display area do not overlap with shift registers. This configuration may avoid the interference of the signals in the shift registers with the signals in the first line segments to ensure the stability of the signal transmitted on the data lines.

Further, in one embodiment, a shift register may comprise a plurality of thin film transistors, and an active layer of the thin film transistor may be made of a material such as an oxide semiconductor material, a polycrystalline silicon semiconductor, an amorphous silicon semiconductor, or the like, or a low temperature polysilicon material. Preferably, the active layer is made of a low-temperature polysilicon material. An active layer made of a low-temperature polysilicon material may have a fast electron migration rate and may shorten the response time of the thin film transistor. Moreover, a thin-film transistor made of a low-temperature polysilicon material may have a small area, and so the space occupied by the drive circuit in the non-display area may be saved.

Figure 12:
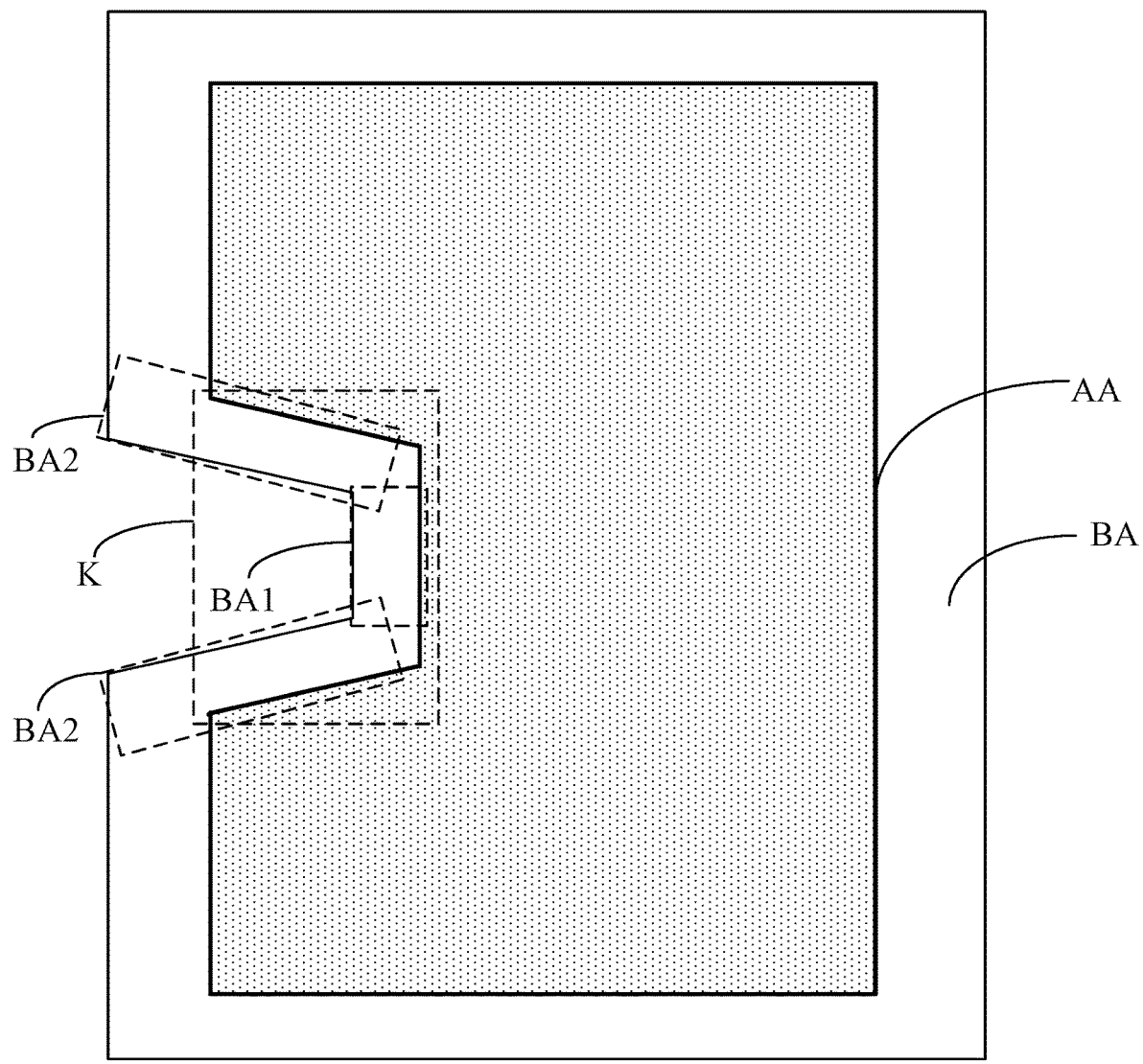
FIG. 12 illustrates a schematic diagram of another exemplary implementation of a display panel consistent with the disclosed embodiments.

In a display panel provided by the present disclosure, a notch may have a rectangle or a trapezoid shape, and in the above embodiments, a rectangle shape is used as an example. FIG. 12 illustrates a schematic diagram of another exemplary implementation of a display panel. As shown in FIG. 12, the notch K has trapezoidal shape. In actual products, notch shapes may be designed according to specific design requirements.

Figure 13:
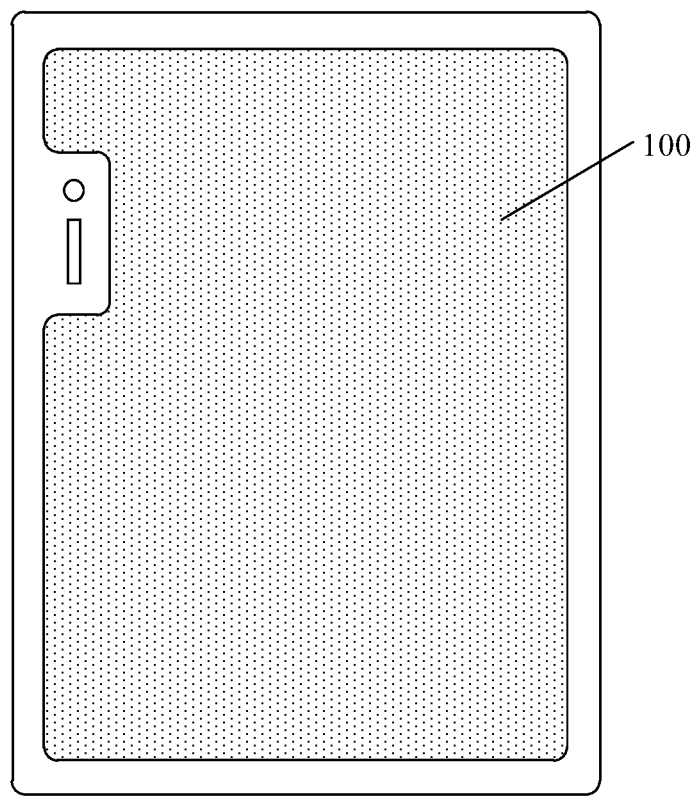
FIG. 13 illustrates a schematic diagram of an exemplary display device consistent with the disclosed embodiments.

The present disclosure further provides a display device, and FIG. 13 illustrates a schematic view of an exemplary display device. As shown in FIG. 13, the display device includes a display panel 100 provided by any embodiments of the present disclosure. The display device may be any electronic product having a flexible display function, including but not limited to the following categories: a television set, a notebook computer, a desktop display, a tablet computer, a digital camera, a mobile phone, a smart bracelet, intelligent glasses, car monitors, medical equipment, industrial equipment, touch interactive terminals, etc.

Figure 14:
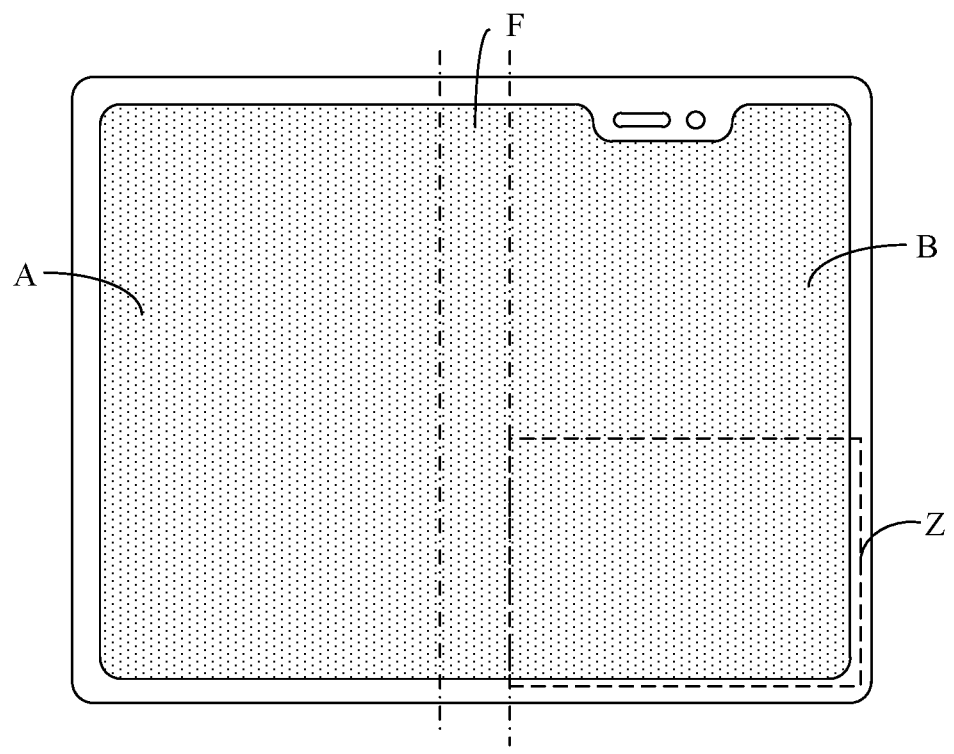
FIG. 14 illustrates schematic view of an exemplary implementation of a display device consistent with the disclosed embodiments.

FIG. 14 illustrates a schematic view of an exemplary implementation of a display device. As shown in FIG. 14, the display device includes two display surfaces A and B, and at least one side display surface F connecting the A side and the B side. Each display surface of the display device is a complete piece of flexible display panel. The display device may be bent along the side display surface F, and the A side and the B side are respectively placed on opposite sides. The display surface of the A side of the display device is a full screen display, and a component area such as a camera and a sensor is reserved on the B side. The electronic paper display area Z may be included on the display surface of the B side. In the electronic paper display area Z, information such as time, date, weather, mobile phone signal, and electricity quantity may be displayed.

It may be seen from the above embodiments that in a display panel of the present invention, shift registers in a second non-display area are electrically connected to signal lines in a first display area to drive the signal lines in the first display area. This configuration may reduce the number of shift registers in the first non-display area, and maybe no shift register is disposed in the first non-display area. In this way, the space in the first non-display area may be saved, and thus the first non-display area may be narrowed.

The embodiments disclosed herein are exemplary only and not limiting the scope of this disclosure. Various combinations, alternations, modifications, or equivalents to the technical solutions of the disclosed embodiments can be obvious to those skilled in the art and can be included in this disclosure. Without departing from the spirit and scope of this invention, such other modifications, equivalents, or improvements to the disclosed embodiments are intended to be encompassed within the scope of the present disclosure.

What is claimed is:

1. A display panel comprising:
   a display area, wherein the display area is disposed with a plurality of data lines extending along a first direction; the display area has a notch, and a boundary of the display area is recessed into the display area in a second direction to form the notch; and the display area includes a first display area and two second display areas;
   a non-display area disposed around the display area, wherein the non-display area includes a first non-display area and two second non-display areas located in the notch; the first non-display area extends along the first direction, and is adjacent to the first display area in the second direction; and, in the first direction, each of the second non-display areas is adjacent to one of the second display areas; and
   a drive circuit, wherein the drive circuit includes a plurality of shift registers,
   wherein:
   the second direction intersects with the first direction;
   in the second direction, the first display area is located at one side of the notch; in the first direction, the two second display areas are located at two sides of the notch respectively, and the two second display areas are adjacent to the first display area;
   the display area includes a plurality of signal lines extending along the second direction, and one shift register is electrically connected to at least one signal line; and the second non-display areas are disposed with the shift registers, and the shift registers disposed in each of the second non-display areas are sequentially arranged in the second direction and electrically connected to the signal lines located in the first display area.

2. The display panel according to claim 1, wherein no shift register is disposed in the first non-display area.

3. The display panel according to claim 1, wherein two signal lines located in the first display area and adjacent in the first direction are electrically connected to a same shift register.

4. The display panel according to claim 1, wherein:
the non-display area further includes a third non-display area extending along the first direction; in the second direction, the third non-display area and the first non-display area are respectively located at two sides of the first display area;
the third non-display area is disposed with shift registers; and
two ends of one signal line located in the first display area are electrically connected to two shift registers located at the second non-display area and the third non-display areas respectively.

5. The display panel according to claim 1, wherein:
the non-display area further includes a third non-display area extending along the first direction; in the second direction, the third non-display area and the first non-display area are respectively located at two sides of the first display area;
the third non-display area is disposed with shift registers;
the signal lines include a first signal line and a second signal line that are adjacent in the first direction; and
the first signal lines located in the first display area are electrically connected to the shift registers located in the second non-display area, and the second signal lines located in the first display area are electrically connected to the shift registers located in the third non-display area.

6. The display panel according to claim 1, wherein the drive circuit includes a scan drive circuit, and the scan drive circuit includes a plurality of cascaded scan shift registers.

7. The display panel according to claim 1, wherein the drive circuit includes a light emitting drive circuit, and the light emitting drive circuit includes a plurality of cascaded light-emitting shift registers.

8. The display panel according to claim 1, wherein:
the drive circuit includes a scan drive circuit and a light emitting drive circuit; and
the scan drive circuit includes a plurality of cascaded scan shift registers, and the light emitting drive circuit includes a plurality of cascaded light-emitting shift registers.

9. The display panel according to claim 8, wherein:
in a same second non-display area, the scan shift registers are located at a side of the light-emitting shift registers close to the second display area.

10. The display panel according to claim 8, wherein:
the signal line includes a scan line, and two ends of the scan line are respectively connected to two scan shift registers respectively located at two sides of the display area in the second direction;
the signal line further include a light-emitting control line, and the light-emitting control line includes a first light-emitting control line and a second light-emitting control line that are adjacent in the first direction;
the light-emitting shift register includes a first light-emitting shift register and a second light-emitting shift register; in the second direction, the first light-emitting shift register and the second light-emitting shift register are respectively located at two sides of the display area; and
the first light-emitting control line is connected to the first light-emitting shift register, and the second light-emitting control line is connected to the second light-emitting shift register.

11. The display panel according to claim 1, wherein:
in a same second non-display area, all the shift registers are sequentially arranged in the second direction.

12. The display panel according to claim 11, wherein:
in a same second non-display area, the scan shift registers and the light-emitting shift registers are alternately arranged in the second direction.

13. The display panel according to claim 11, wherein:
in the two second non-display areas, one of the second non-display areas is disposed with scan shift registers, and the other second non-display area is disposed with light-emitting shift registers.

14. The display panel according to claim 1, wherein:
the signal line includes a scan line, and two ends of the scan line are respectively connected to two scan shift registers respectively located at two sides of the display area in the second direction;
the scan line includes in a first scan line and a second scan line that are adjacent in the second direction, and the first scan line and the second scan line are connected to a same scan shift register; and
the signal line further include a light-emitting control line, and two ends of the light-emitting control line are respectively connected to two light-emitting shift registers respectively located at two sides of the display area in the second direction.

15. The display panel according to claim 1, wherein:
a plurality of connecting lines are disposed in the non-display area, and two data lines located at two sides of the notch in the first direction and located in a same column are connected through a connecting line; and
the connecting line includes a first line segment and a second line segment that are electrically connected to each other, wherein the first line segment is disposed in the second non-display area, and the second line segment is disposed in the first non-display area.

16. The display panel according to claim 15, wherein:
in the second non-display area, the first line segment and the shift register do not overlap in a direction perpendicular to the display panel.

17. The display panel according to claim 1, wherein:
the shift register comprises a plurality of thin film transistors, and the active layer of the thin film transistors is made of a low temperature polysilicon material.

18. The display panel according to claim 1, wherein the notch has a rectangle shape.

19. The display panel according to claim 1, wherein the notch has a trapezoid shape.

20. A display device, comprising a display panel comprising:
a display area, wherein the display area is disposed with a plurality of data lines extending along a first direction; the display area has a notch, and a boundary of the display area is recessed into the display area in a second direction to form the notch; and the display area includes a first display area and two second display areas;
a non-display area disposed around the display area, wherein the non-display area includes a first non-display area and two second non-display areas located in the notch; the first non-display area extends along the first direction, and is adjacent to the first display area in the second direction; and, in the first direction, each of the second non-display areas is adjacent to one of the second display areas; and a drive circuit, wherein the drive circuit includes a plurality of shift registers, wherein:

the second direction intersects with the first direction;

in the second direction, the first display area is located at one side of the notch; in the first direction, the two second display areas are located at two sides of the notch respectively, and the two second display areas are adjacent to the first display area;

the display area includes a plurality of signal lines extending along the second direction, and one shift register is electrically connected to at least one signal line; and the second non-display areas are disposed with the shift registers, and the shift registers disposed in each of the second non-display areas are sequentially arranged in the second direction and electrically connected to the signal lines located in the first display area.

\* \* \* \* \*